(12) United States Patent
Liou et al.

(10) Patent No.: US 9,870,944 B2
(45) Date of Patent: *Jan. 16, 2018

(54) BACK-END-OF-LINE (BEOL) INTERCONNECT STRUCTURE

(71) Applicant: Taiwan Semiconductor Manufacturing Company Limited, Hsinchu (TW)

(72) Inventors: Joung-Wei Liou, Hsinchu County (TW); Keng-Chu Lin, Ping-Tung (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 14/797,273

(22) Filed: Jul. 13, 2015

(65) Prior Publication Data
US 2015/0318207 A1    Nov. 5, 2015

Related U.S. Application Data

(63) Continuation of application No. 13/942,802, filed on Jul. 16, 2013, now Pat. No. 9,093,455.

(51) Int. Cl.
*H01L 21/768* (2006.01)
*H01L 23/532* (2006.01)
(Continued)

(52) U.S. Cl.
CPC ...... *H01L 21/76879* (2013.01); *H01L 21/768* (2013.01); *H01L 21/7684* (2013.01); *H01L 21/76825* (2013.01); *H01L 21/76826* (2013.01); *H01L 21/76831* (2013.01); *H01L 21/76847* (2013.01); *H01L 21/76886* (2013.01); *H01L 23/528* (2013.01); *H01L 23/5226* (2013.01); *H01L 23/5329* (2013.01);
(Continued)

(58) Field of Classification Search
CPC ... H01L 24/81; H01L 23/49811; H01L 25/50; H01L 21/76877; H01L 23/5226; H01L 24/19; H01L 21/76879
See application file for complete search history.

(56) References Cited

U.S. PATENT DOCUMENTS 5,627,098 A * 5/1997 Iranmanesh ........ H01L 23/5252
                                                    438/627
5,918,149 A    6/1999 Besser et al.
(Continued)

OTHER PUBLICATIONS

VLSI Research Inc.; Impact Appraisal: BEOL Wiring Process for CMOS Logic; Feb. 1995.

*Primary Examiner* — Marc Armand
*Assistant Examiner* — Quinton Brasfield
(74) *Attorney, Agent, or Firm* — Jones Day

(57) ABSTRACT

A method of fabricating an interconnect structure on a wafer and an interconnect structure are provided. A dielectric layer is provided on the wafer, with the dielectric layer having a recess therein. A silicon (Si) layer is deposited in the recess. An interconnect is formed by providing a barrier layer and a conductive layer in the recess over the Si layer. The Si layer has a density that prevents or substantially prevents the barrier layer from moving away from the conductive layer and towards the dielectric layer during subsequent processing of the interconnect structure.

20 Claims, 5 Drawing Sheets

(51) Int. Cl.
   *H01L 23/522*   (2006.01)
   *H01L 23/528*   (2006.01)
(52) U.S. Cl.
   CPC .. *H01L 23/53238* (2013.01); *H01L 23/53271* (2013.01); *H01L 2924/0002* (2013.01)

(56) References Cited

U.S. PATENT DOCUMENTS

| | | |
|---|---|---|
| 6,548,901 B1 | 4/2003 | Cote et al. |
| 9,093,455 B2 * | 7/2015 | Liou ................. H01L 23/53238 |
| 2005/0186787 A1 * | 8/2005 | Jung ................. H01L 21/76831 |
| | | 438/653 |
| 2007/0015355 A1 * | 1/2007 | Lin ................... H01L 21/76834 |
| | | 438/624 |
| 2011/0256715 A1 * | 10/2011 | Pan ................... H01L 21/76831 |
| | | 438/653 |
| 2012/0171860 A1 | 7/2012 | Yang et al. |
| 2012/0228770 A1 | 9/2012 | Yang et al. |
| 2012/0235304 A1 | 9/2012 | Huisinga et al. |

\* cited by examiner

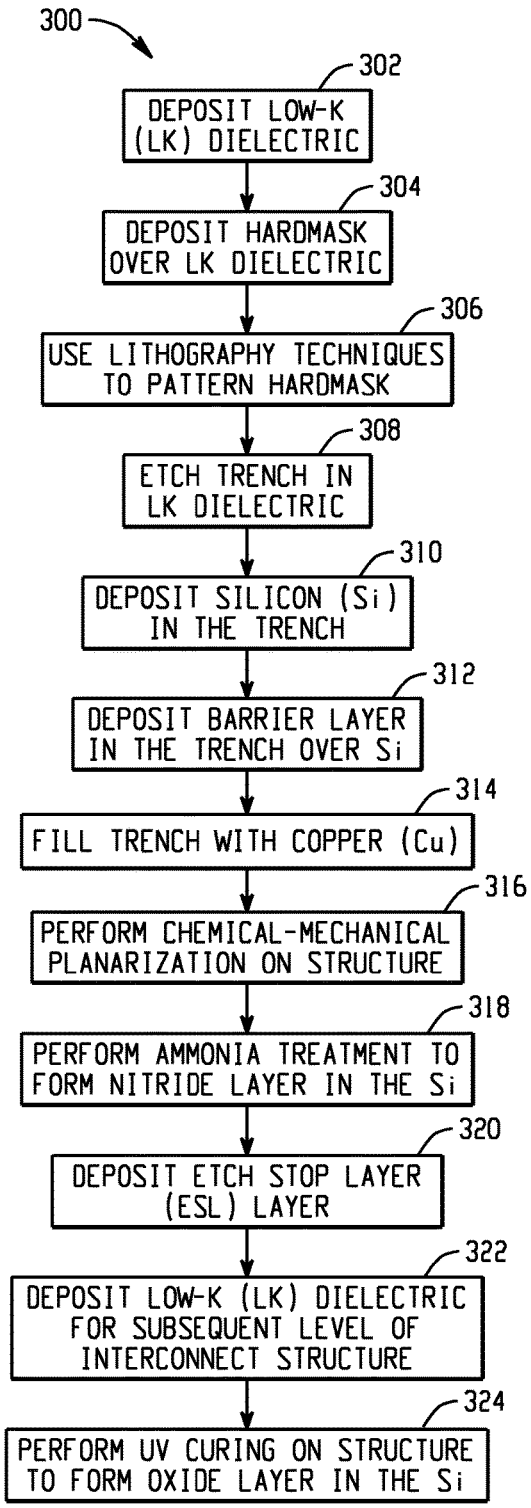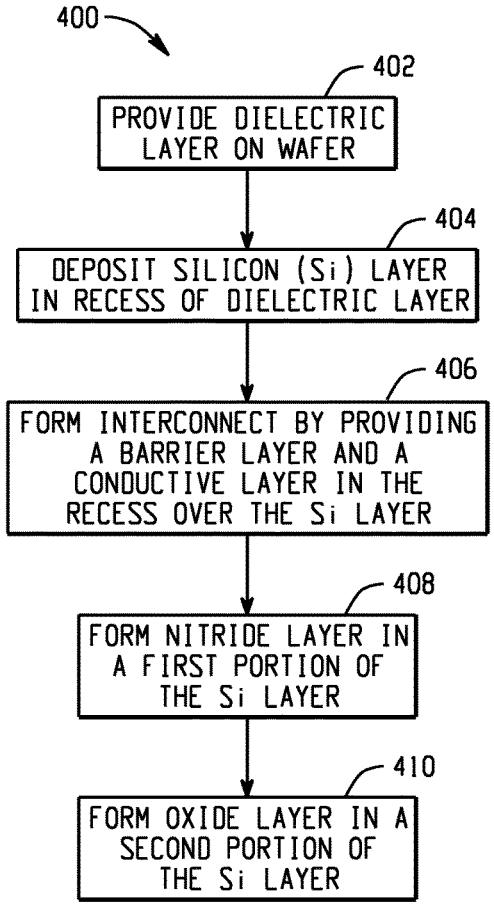
Fig. 3
Fig. 4

BACK-END-OF-LINE (BEOL) INTERCONNECT STRUCTURE

CROSS-REFERENCE TO RELATED APPLICATIONS

This application is a continuation application of U.S. patent application Ser. No. 13/942,802, entitled "BACK-END-OF-LINE (BEOL) INTERCONNECT STRUCTURE" filed Jul. 16, 2013, which is incorporated herein by reference in its entirety.

BACKGROUND

Integrated circuits (ICs) generally include a plurality of semiconductor devices (transistors, capacitors, resistors, etc.). Back-end-of-line (BEOL) processing is used to interconnect the plurality of semiconductor devices with wiring on the wafer and is also used to form contacts, insulating layers (dielectrics), metal levels, and bonding sites for chip-to-package connections. BEOL interconnects, including metal wiring lines and inter-level vias, carry direct current (DC) in the integrated circuits. Within BEOL interconnect structures, metal wiring lines run parallel to the substrate, and conductive vias run perpendicular to the substrate, with the conductive vias interconnecting different levels of the metal wiring lines. Typically, copper is used as the interconnect metal in BEOL interconnect structures, due to the higher conductivity of copper as versus metals such as aluminum.

BRIEF DESCRIPTION OF THE FIGURES

FIG. 3 is a flowchart illustrating an example method of using a dense dielectric layer in a back-end-of-line (BEOL) interconnect.

FIG. 4 is a flowchart illustrating an example method of fabricating an interconnect structure on a wafer.

DETAILED DESCRIPTION

Figure 1:
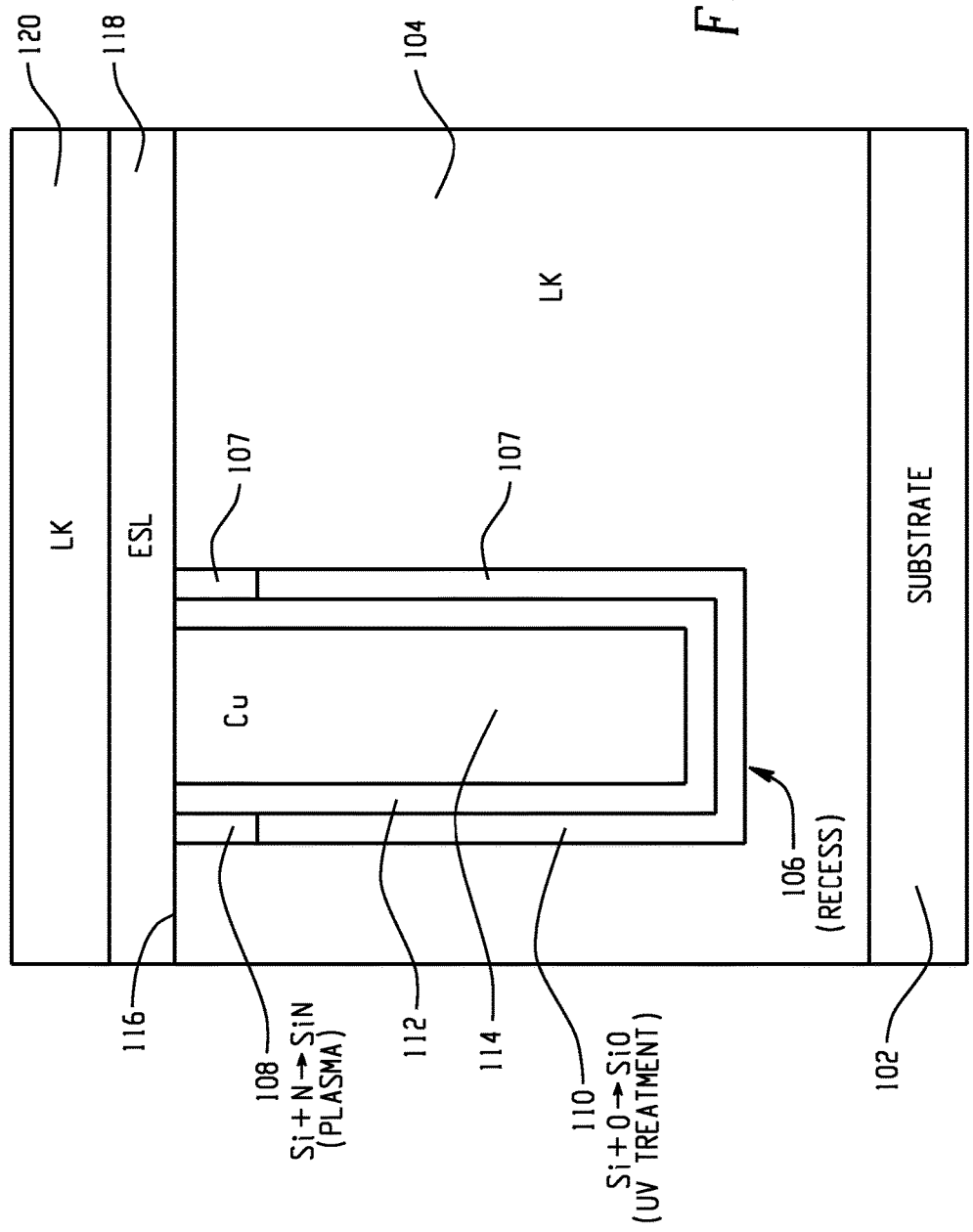
FIG. 1 depicts an example interconnect structure formed on a substrate, where the example interconnect structure includes a dielectric layer that may be used to prevent a degradation of an interface between a barrier layer and a conductive layer.

FIG. 1 depicts an example interconnect structure formed on a substrate 102, where the example interconnect structure includes a dielectric layer 107 that may be used to prevent a degradation of an interface between a barrier layer 112 and a conductive layer 114. In FIG. 1, the example interconnect structure may include a low-k dielectric layer 104 having a recess 106. The low-k dielectric layer 104 may comprise SiOC material (e.g., SiOC having a dielectric constant k of between approximately 2.0 and 3.5) or another material having a dielectric constant k that is less than about 3.9. The dielectric layer 107 that may be used to prevent the degradation of the interface between the barrier layer 112 and the conductive layer 114 may be a silicon (Si) layer (e.g., an amorphous Si layer) that is deposited into the recess 106 of the low-k dielectric layer 104. The example interconnect structure may further include the barrier layer 112 and the conductive layer 114 that are deposited in the recess 106 substantially over the dielectric layer 107. Like the dielectric layer 107, the barrier layer 112 may be deposited in a manner that causes sidewalls and a bottom of the recess 106 to be substantially coated. The conductive layer 114 may be deposited to coat the sidewalls and the bottom of the recess 106 and to also substantially fill the recess 106 (i.e., the conductive layer 114 may be deposited using a metal fill technique). In the example of FIG. 1, the barrier layer 112 may be comprised of various materials including TiN, TaN, WN, RuTa(N), and RuN, and the conductive layer 114 may comprise copper (Cu), among other materials.

The example interconnect structure of FIG. 1 may undergo a planarization procedure (e.g., via a chemical mechanical polishing or chemical mechanical planarization procedure), such that portions of the dielectric layer 107, the barrier layer 112, and the conductive layer 114 may become substantially coplanar with a top surface 116 of the low-k dielectric layer 104. Above the substantially planarized structure, an etch stop layer (ESL) 118 may be deposited, and a second low-k dielectric layer 120 may be deposited over the ESL 118. The ESL 118 may be formed using insulating materials including SiCN, SiN, SiC, SiCO, and $SiO_2$, and may be deposited using a chemical vapor deposition (CVD) process, a physical vapor deposition (PVD) process, or an atomic layer deposition (ALD) process, for example. The ESL 118 may include material or materials that are resistant to an etchant, where the etchant is used to remove one or more layers of the structure (e.g., the second low-k dielectric layer 120 deposited above the ESL 118 or the low-k dielectric layer 104 below the ESL 118). The second low-k dielectric layer 120 may be comprised of a material that is the same as or similar to that of the dielectric layer 104 (e.g., SiCOH, as one non-limiting example, or another material having a dielectric constant k that is less than 3.9).

After the planarization but before the deposition of the ESL 118, a nitride layer 108 may be formed in a first portion of the Si layer 107. The nitride layer 108 may be substantially adjacent to the top surface 116 of the planarized structure and may be formed by exposing the structure to a nitrogen treatment (e.g., a nitrogen plasma treatment using an $NH_3$ ammonia plasma that is administered in a plasma enhanced chemical vapor deposition (PECVD) chamber). The nitrogen treatment may cause the nitride layer 108 to form near the top surface 116 of the low-k dielectric layer 104, extending a depth of approximately 0 Å to 200 Å from the top surface 116 (i.e., extending 0 Å to 200 Å in a direction that is perpendicular or approximately perpendicular to the top surface 116). The nitride layer 108 formed in the first portion of the Si layer 107 may thus be of a silicon nitride composition (e.g., $Si_3N_x$, where x is within a range of approximately 1 to 4). As depicted in FIG. 1 at 108, silicon nitride may be formed by the addition of nitrogen atoms to the Si layer 107, where the nitrogen atoms are added via the nitrogen plasma treatment.

After the deposition of the ESL 118 and the second low-k dielectric layer 120, an oxide layer 110 may be formed in a second portion of the Si layer 107. The oxide layer 110 may be formed via an ultraviolet (UV) curing process (e.g., a UV curing process performed in the presence of an $O_2$ or an $O_3$ gas). The UV curing process may cause the oxide layer 110 to form throughout an entirety of the Si layer 107. Thus, whereas the nitride layer 108 may be formed only near the top surface 116 of the low-k dielectric layer 104, the oxide layer 110 may be formed throughout the Si layer 107 (i.e., not only near the top surface of the structure). Although the oxide layer 110 is depicted in FIG. 1 as being substantially adjacent to the nitride layer 108, the oxide layer 110 in some examples may be formed throughout the Si layer 107, such that the nitride layer 108 may include oxygen atoms due to the UV curing (i.e., because the oxide layer 110 may be formed after nitride layer 108, the nitride layer 108 may not only include Si and N atoms but may also include O atoms as a result of the UV curing). The oxide layer 110 formed substantially beneath the nitride layer 108 (i.e., portions of the oxide layer 110 that do not include nitrogen) may have a composition of $SiO_x$, where x is within a range of approximately 1 to 2. This is depicted in FIG. 1 at 110, which illustrates that an addition of O atoms to the silicon of the Si layer 107 as a result of the UV treatment may form the silicon oxide layer 110.

The nitrogen treatment and the UV curing procedure may be performed to increase a density of the Si layer 107, such that the Si layer 107 may have a density that prevents or substantially prevents the barrier layer 112 from moving away from the conductive layer 114 during processing of the interconnect structure. Structures similar to that depicted in FIG. 1 but lacking the Si layer 107 may have reliability issues and issues with electro-migration and stress migration. For example, during UV curing of a metal layer deposited above the low-k dielectric layer 104 (e.g., a metal layer deposited on a level $M_{x+1}$ of the structure, where the low-k dielectric layer 104 is part of a level $M_x$), the low-k dielectric layer 104 may shrink. In the structures lacking the Si layer 107, the shrinking of the low-k dielectric layer 104 may cause the barrier layer 112 to be pulled towards the low-k dielectric layer 104 and away from the conductive layer 114. With the barrier layer 112 pulled toward the low-k dielectric layer 104, there may be lower adhesion between the barrier layer 112 and the conductive layer 114, thus causing the reliability concerns and the possible issues with electro-migration and stress migration.

In the example of FIG. 1, the Si layer 107 and the procedures used to increase the density of the Si layer 107 (i.e., the nitrogen treatment used to form the nitride layer 108 in the Si layer 107 and the UV curing treatment used to form the oxide layer 110 in the Si layer 107) may thus enable improved performance of the barrier layer 112 by reducing an adhesion impact during the next level UV curing. The example interconnect structure and method of fabricating an interconnect described with reference to FIG. 1 may be used in back-end-of-line (BEOL) processing, where the BEOL processing includes interconnection of individual devices (e.g., transistors, capacitors, resistors, etc.) with wiring on the wafer, as well as formation of contacts, insulating layers, metal levels, and bonding sites for chip-to-package connections.

Figure 2A:
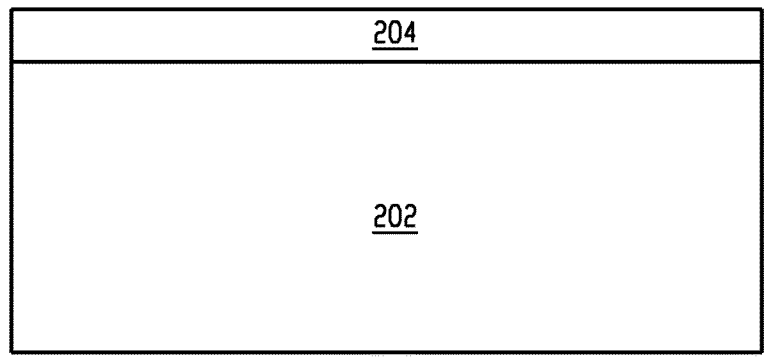
FIG. 2A shows a beginning structure used in an example method of fabricating an interconnect structure on a wafer.

FIG. 2A shows a beginning structure used in an example method of fabricating an interconnect structure on a wafer. The beginning structure includes a sacrificial dielectric layer 204 deposited substantially over a dielectric layer 202. The sacrificial dielectric layer 204 may be, for example, silicon dioxide ($SiO_2$) that functions as a hard mask in the method of fabricating the interconnect structure. The $SiO_2$ hard mask may be used in the example method as an etch mask in lieu of a polymer or other organic, soft photoresist material, as described in further detail below. The sacrificial dielectric layer 204 may be deposited using a number of different procedures, such as, for example, a spin on process, a chemical vapor deposition (CVD) process, or a physical vapor deposition (PVD) process. The dielectric layer 202 may be a low dielectric constant ("low-k") dielectric that may be SiCOH, as one non-limiting example. The low-k dielectric layer 202 may be used as an interlevel dielectric (ILD) layer in the interconnect structure and is used to electrically separate closely spaced interconnect lines in a multilevel metallization scheme. The low-k material used in the dielectric layer 202 may have a dielectric constant k lower than 3.9 in order to reduce undesired capacitive coupling, and hence, "cross talk," between metal lines of the structure.

Figure 2B:
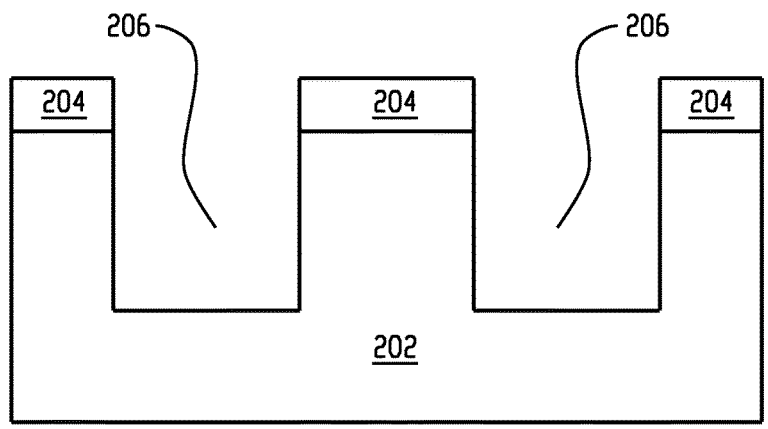
FIG. 2B shows recesses etched into a low-k dielectric layer and a sacrificial dielectric layer for fabricating the interconnect structure.

FIG. 2B shows recesses 206 etched into the low-k dielectric layer 202 and the sacrificial dielectric layer 204. The recesses 206 may be trenches etched into the low-k dielectric layer 202 and the sacrificial dielectric layer 204 using a lithography process and an etching process. For example, a photoresist may be applied over the sacrificial dielectric layer 204 and exposed to light to form openings in the photoresist. Using the photoresist as a mask, the sacrificial dielectric layer 204 may be etched to transfer the pattern in the photoresist to the sacrificial dielectric layer 204. With the sacrificial dielectric layer 204 patterned in this manner, the sacrificial dielectric layer 204 can then function as a mask in etching the low-k dielectric layer 202. For example, after patterning the sacrificial dielectric layer 204, a wet etch (e.g., a buffered hydrofluoric acid etch) or a dry etch (e.g., reactive ion etching (RIE)) may be used to form the recesses 206 in the low-k dielectric layer 202.

Figure 2C:
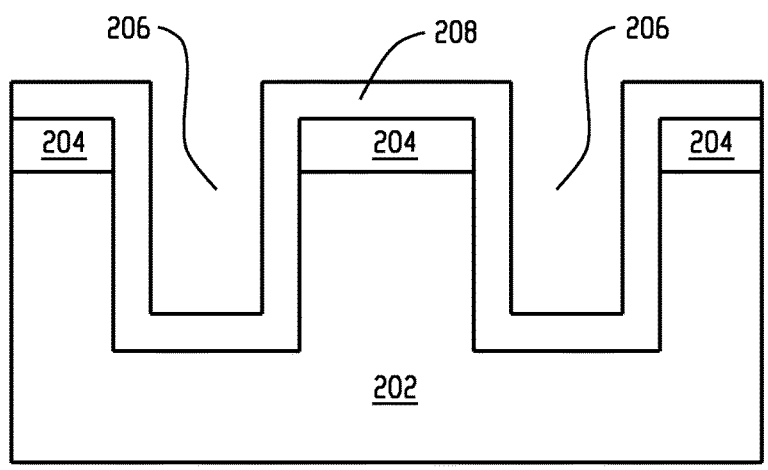
FIG. 2C shows a silicon (Si) layer deposited in the recesses for fabricating the interconnect structure.

FIG. 2C shows a silicon (Si) layer 208 deposited in the recesses 206. The Si layer 208 may be deposited prior to a deposition of a barrier layer in the recesses 206 (as described below) and may comprise amorphous Si that is deposited to a thickness of between approximately 5 Å and 100 Å. In one example, the Si layer 208 may have a thickness of approximately 20 Å. The deposition of the Si layer 208 may be performed at a low temperature (e.g., less than 500 degrees Celsius) using a plasma-enhanced chemical vapor deposition (PECVD) process, an atomic layer deposition (ALD) process, or a physical vapor deposition (PVD) process. The recesses 206 may include sidewalls that are vertical or approximately vertical, and the process and parameters used in depositing the Si layer 208 may be selected to cause the sidewalls of the recesses 206 to be substantially covered with silicon in the deposition. As described below, with reference to FIGS. 2G and 2I, a density of the Si layer 208 may be increased via a nitrogen treatment and an ultraviolet (UV) curing process, with the increased density of the Si layer 208 being used to prevent or substantially prevent a barrier layer from being pulled towards the low-k dielectric layer 202 during subsequent processing of the interconnect structure.

Figure 2D:
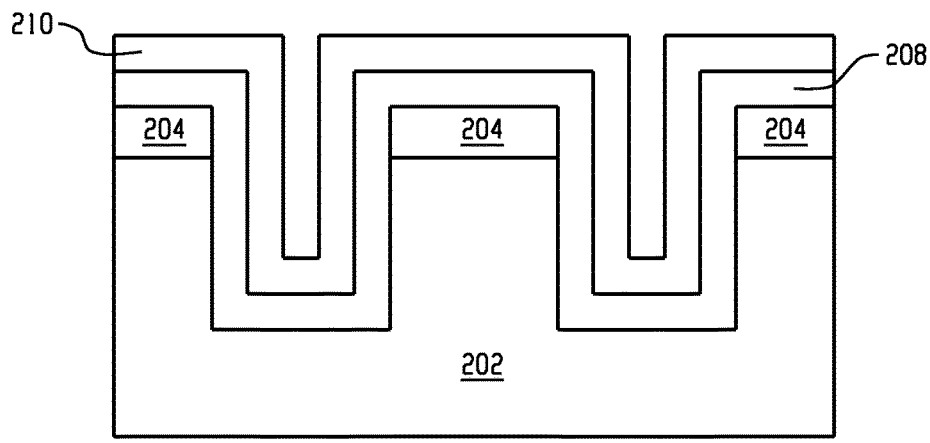
FIG. 2D shows a barrier layer deposited in the recesses substantially over the Si layer.

FIG. 2D shows a barrier layer 210 deposited in the recesses 206 substantially over the Si layer 208. The barrier layer 210 is a cap layer that may prevent a metal that is subsequently deposited in the recesses (e.g., copper) from diffusing into the low-k dielectric layer 202. The barrier layer 210 may be, for example, TiN, TaN, WN, RuTa(N) or RuN, and the deposition process used to deposit the barrier layer may be, for example, chemical vapor deposition (CVD), physical vapor deposition (PVD), or atomic layer deposition (ALD). In some examples, the barrier layer 210 has a thickness of approximately 20 Å to 100 Å.

Figure 2E:
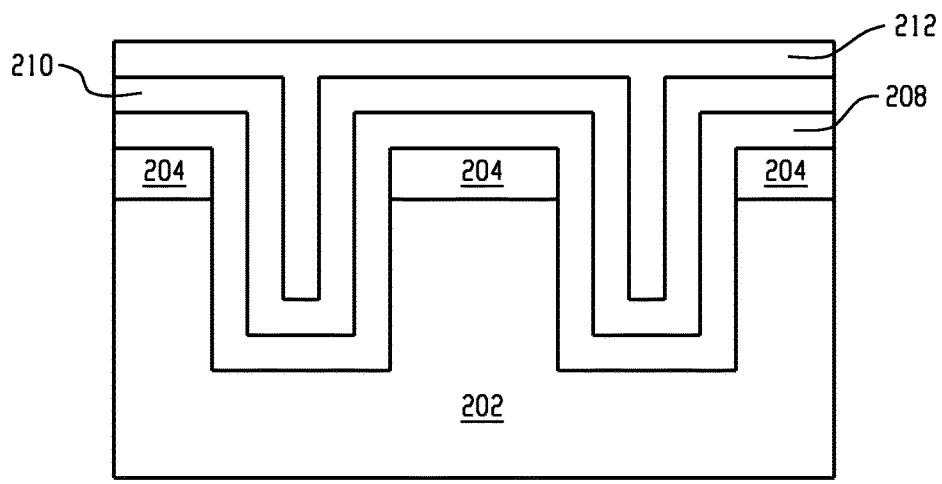
FIG. 2E shows a conductive layer deposited in the recesses substantially over the Si layer and the barrier layer.
Figure 2F:
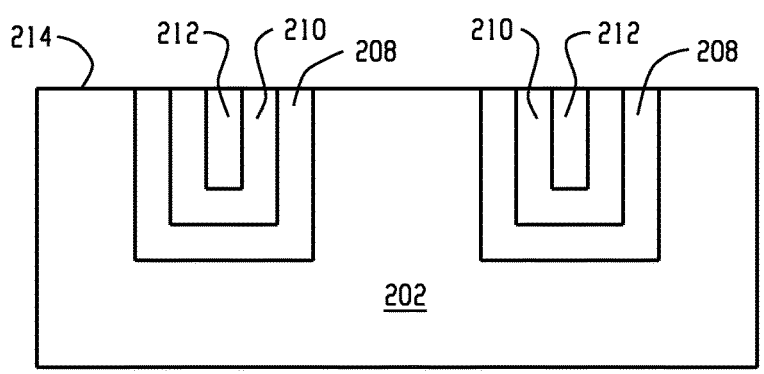
FIG. 2F shows a planarization of the structure.

FIG. 2E shows a conductive layer 212 deposited in the recesses 206 substantially over the Si layer 208 and the barrier layer 210. In the example of FIG. 2E, the conductive layer 212 may fill the recesses 206, thus forming the conductive portion of an interconnect. The conductive layer 212 may be comprised of, for example, copper (Cu) or Cu(Al). FIG. 2F shows a planarization of the structure. The planarization of the structure may be accomplished via a chemical mechanical planarization or chemical mechanical polishing (CMP), which is a process of smoothing a surface using a combination of chemical and mechanical forces. The planarizing of the structure may cause portions of the Si layer 208, the barrier layer 210, and the conductive layer 212 to be substantially coplanar with a top surface 214 of the low-k dielectric layer 202 (i.e., the portions of the Si layer 208, the barrier layer 210, and the conductive layer 212 may be exposed at the top surface 214 of the structure). In the planarization of the structure depicted in FIG. 2F, the hard mask layer 204 may be substantially removed by the planarization process.

Figure 2I:
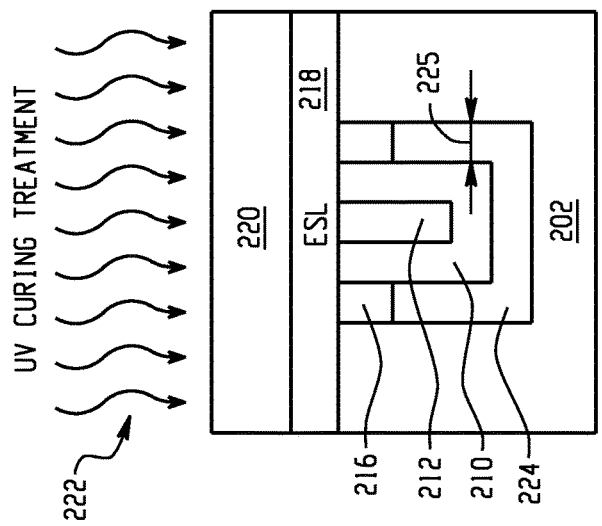
FIG. 2I shows the structure being exposed to an ultraviolet (UV) curing treatment to form an oxide layer in a second portion of the Si layer.
Figure 2H:
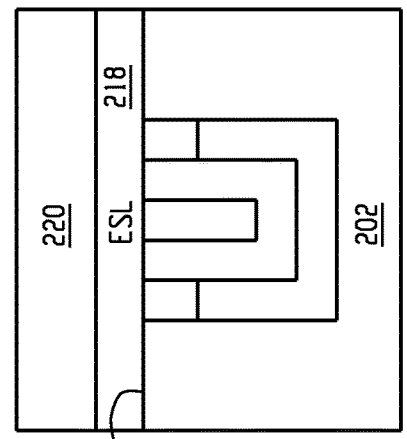
FIG. 2H shows an etch stop layer (ESL) and a second dielectric layer deposited substantially over the planarized structure.
Figure 2G:
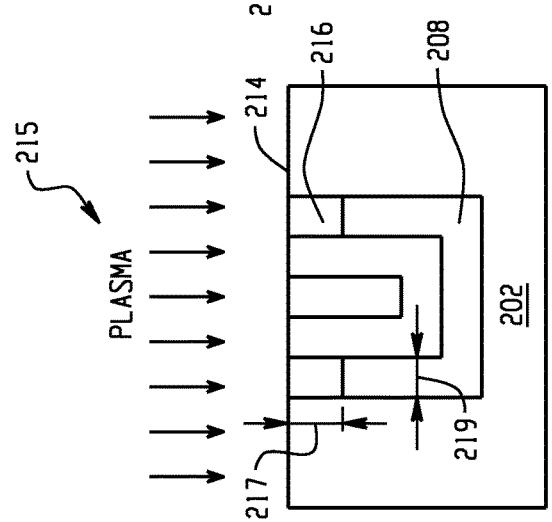
FIG. 2G shows the structure being exposed to a nitrogen treatment to form a nitride layer in a first portion of the Si layer.

FIG. 2G shows the structure being exposed to a nitrogen treatment to form a nitride layer 216 in a first portion of the Si layer 208. As illustrated in FIG. 2G, the first portion of the Si layer 208 in which the nitride layer 216 is formed may be substantially adjacent to the top surface 214 of the dielectric layer 202. The nitride layer 216 may extend a depth 217 of approximately 0 Å to 200 Å from the top surface 214 of the dielectric layer 202 and may have a thickness 219 of approximately 5 Å to 100 Å. The depth 217 is measured in a direction that is perpendicular (or approximately perpendicular) to the top surface 214, and the thickness 219 is measured in a direction that is parallel (or approximately parallel) to the top surface 214. In one example, the depth 217 is equal to approximately 100 Å. As illustrated by the depth 217 of approximately 0 Å to 200 Å, the nitride layer 216 may be formed only at an upper part of the structure (i.e., closer to the top surface 214 that is exposed to the nitrogen treatment). The nitrogen treatment depicted in FIG. 2G may occur contemporaneously with a deposition of another metal (e.g., the treatment may be performed during a cobalt (Co) deposition, where the Co material is deposited over the copper layer 212 at the substantially planarized surface 214 of the structure) or prior to a deposition of an etch stop layer on the structure (as described below with reference to FIG. 2I).

In FIG. 2G, the nitrogen treatment may be performed using a nitrogen-containing plasma 215 that substantially transforms the first portion of the Si in the Si layer 208 to a silicon nitride layer. The nitrogen treatment may be performed using a plasma enhanced chemical vapor deposition (PECVD) process at a temperature of 350 degrees Celsius or approximately equal to 350 degrees Celsius. The nitrogen-containing plasma 215 may use $N_2$ or $NH_3$ gases to form a $Si_3N_x$ layer, where x is between approximately 1 and 4, or N is less than 60% at percentage weight (e.g., $Si_3N_4$ or Si-rich SiN). The substantial transformation of the first portion of the Si layer 208 from a silicon layer to the silicon nitride layer 216 may increase a density of the silicon in the first portion. The increase in the density may be due to, among other things, the addition of the extra nitrogen atoms to the Si layer 208.

FIG. 2H shows an etch stop layer (ESL) 218 and a second dielectric layer 220 deposited over the substantially planarized structure. The ESL 218 may be formed using insulating materials including silicon nitride, silicon carbide, and various oxides, and may be deposited using various CVD, PVD, or ALD processes. The ESL 218 may include material or materials that are resistant to an etchant, where the etchant may be used to remove material from one or more layers of the structure (e.g., the dielectric layers 202, 220). The second dielectric layer 220 may be a low dielectric constant ("low-k") dielectric that may be comprised of a material that is the same as or similar to that of the dielectric layer 202 (e.g., SiCOH, as one non-limiting example). The low-k dielectric layer 220 may be used as an interlevel dielectric (ILD) layer to electrically separate closely spaced interconnect lines in a multilevel metallization scheme. Similar to the low-k dielectric layer 202, the low-k material used in the dielectric layer 220 may have a dielectric constant k lower than 3.9. The deposition of the ESL 218 and the second dielectric layer 220 may occur after the nitrogen treatment shown in FIG. 2G.

FIG. 2I shows the structure being exposed to an ultraviolet (UV) curing treatment 222 to form an oxide layer 224 in a second portion of the Si layer 208. The UV curing treatment 222 may be performed after the deposition of the second dielectric layer 220 and may be used to transform the silicon in the second portion of the Si layer 208 to the oxide layer 224 (i.e., a silicon oxide layer). As illustrated in FIG. 2I, the oxide layer 224 may be substantially adjacent to the nitride layer 216, with the oxide layer 224 being formed throughout a bottom portion of the Si layer 208 (i.e., areas of the Si layer 208 that are below the nitride layer 216 in the structure). In other examples, the oxide layer may be formed in an entirety of the Si layer 108. In these examples, the nitride layer 216 is not necessarily purely silicon nitride but rather also includes a silicon oxide component. The oxide layer may have a thickness 225 of approximately 5 Å to 100 Å and a composition of $SiO_x$, where x may be within a range of approximately 1 to 2 (i.e., a composition of O that is less than 70% at percentage weight).

The UV curing treatment 222 may include exposing the structure to ultraviolet radiation having a wavelength in a range of approximately 200 nm to 400 nm. The UV curing treatment 222 may be performed at a temperature of between approximately 200 to 500 degrees Celsius, at a pressure within a range of approximately 1 Torr to 100 Torr, and for a length of time within a range of approximately 30 seconds to 10 minutes. Further, the UV curing treatment 222 may be performed in the presence of a gas, where the gas may include one or more of Helium, Argon, $N_2$, $O_2$, and $O_3$ (i.e., only one of the Helium, Argon, $N_2$, $O_2$, and $O_3$ gases may be used, or alternatively, multiple of the gases may be combined in the UV treatment process 222). In one example, the oxide layer 224 and the nitride layer 216 surrounding the barrier layer 210 have thicknesses of 20 Å, and an $O_3$ gas is used in the UV curing treatment 222.

In FIGS. 2G and 2I, a density of the Si layer 208 may be increased using the nitrogen treatment and the UV curing treatment 222. In each case, a higher density silicon film may be produced by the addition of the extra atoms that may occur via the nitrogen treatment and the UV curing treatment 222. In the nitrogen treatment (i.e., using the $N_2$ plasma treatment or the $NH_3$ plasma treatment), extra nitrogen atoms may be added to the amorphous Si layer 208, thus increasing the density of the Si layer 208 and forming the silicon nitride layer 216 near the top of the Si layer 208. In the UV curing treatment 222 (e.g., performed in the presence of an O₃ gas), extra oxygen atoms may be added to the amorphous Si layer 208, thus increasing the density of the Si layer 208 and forming the silicon oxide layer in the Si layer 208.

For both the nitrogen treatment and the UV curing treatment 222, the density of the Si layer 208 may be increased because a volume of the Si layer 208 may be constrained by the surrounding structure. Because the Si layer 208 is bound on one side by the low-k dielectric layer 202 and is bound on the other side by the barrier layer 210 and the conductive layer 212, a volume of the Si layer 208 may not be permitted to increase during either of the nitrogen treatment or the UV curing treatment 222. Thus, when the extra N atoms and O atoms are added during these respective processes, the density of the Si layer 208 may be caused to increase. The Si layer 208, with the increased density resulting from the nitrogen treatment and the UV curing treatment 222, may have a density that prevents or substantially prevents the barrier layer 210 from moving away from the conductive layer 212 and towards the low-k dielectric layer 202 during subsequent processing of the structure. As described above with reference to FIG. 1, the low-k dielectric layer 202 may shrink during a curing procedure performed on the structure. The shrinking of the low-k dielectric layer 202 may, in the absence of the Si layer 208, pull the barrier layer 210 toward the low-k dielectric layer 202 and away from the conductive layer 212, resulting in a lower adhesion between the barrier layer 210 and the conductive layer 212. By depositing the Si layer 208 and performing the nitrogen treatment and the UV curing treatment 222 to increase the density of the Si layer 208, a prevention of the degradation between the barrier layer 210 and the conductive layer 212 may be achieved.

FIG. 3 is a flowchart 300 illustrating an example method of using a dense dielectric layer in a back-end-of-line (BEOL) interconnect. At 302, a low-k (LK) dielectric is deposited. The low-k dielectric may be deposited on a substrate (e.g., a crystalline Si substrate) or may be deposited on any one of a plurality of levels making up a multi-level semiconductor device. At 304, a hard mask layer may be deposited substantially over the low-k dielectric. The hard mask layer may be a sacrificial layer that may be comprised of a dielectric material (e.g., SiO₂), an inter-metal or metal layer (e.g., TiN or Ti), or a combination of a dielectric material and the inter-metal or metal layer. At 306, a lithography technique (e.g., photolithography or electron beam lithography) may be used to pattern the hard mask layer. Using the patterned hard mask as a mask, at 308, a trench may be etched in the low-k dielectric layer. At 310, a Si layer may be deposited in the trench, substantially covering sidewalls and a bottom portion of the trench. The Si layer may be amorphous Si deposited to a thickness within a range of approximately 5 Å to 100 Å. At 312, a barrier layer may be deposited in the trench substantially over the Si layer, and at 314, the trench may be filled with copper.

At 316, chemical mechanical polishing or chemical mechanical planarization (CMP) may be used to planarize the structure, thus substantially removing the hard mask layer and causing portions of the Si layer, the barrier layer, and the Cu layer to be exposed at the substantially planarized surface of the structure (i.e., the portions of the Si layer, the barrier layer, and the Cu layer may be coplanar with a top surface of the planarized low-k dielectric layer). At 318, an ammonia (NH₃) treatment may be used to transform a portion of the Si layer to a silicon nitride layer. At 320, an etch stop layer (ESL) may be deposited on the planarized structure, and at 322, a second low-k dielectric layer for a subsequent level of the BEOL interconnect structure may be deposited over the ESL. At 324, an ultraviolet (UV) curing is performed on the structure to transform a portion of the Si layer to a silicon oxide layer. As described above with reference to FIGS. 1 and 2A-2I, the transformations of the Si layer to the silicon nitride layer and the silicon oxide layer may cause a densification of the Si layer, which may allow for better adhesion of the barrier layer to the Cu layer during subsequent processing of the structure.

FIG. 4 is a flowchart 400 illustrating an example method of fabricating an interconnect structure on a wafer. At 402, a dielectric layer is provided on the wafer, where the provided dielectric layer has a recess therein. At 404, a silicon (Si) layer may be deposited in the recess. At 406, an interconnect may be formed by providing a barrier layer and a conductive layer in the recess substantially over the Si layer. The Si layer may have a density that prevents or substantially prevents the barrier layer from moving away from the conductive layer and towards the dielectric layer during subsequent processing of the interconnect structure. At 408, a nitride layer may be formed in a first portion of the Si layer. At 410, an oxide layer may be formed in a second portion of the Si layer.

The present disclosure is directed to a method of fabricating an interconnect structure on a wafer and an interconnect structure. In a method of fabricating an interconnect structure on a wafer, a dielectric layer is provided on the wafer, with the dielectric layer having a recess therein. A silicon (Si) layer is deposited in the recess. An interconnect is formed by providing a barrier layer and a conductive layer in the recess over the Si layer. The Si layer has a density that prevents or substantially prevents the barrier layer from moving away from the conductive layer and towards the dielectric layer during subsequent processing of the interconnect structure.

In another example, an interconnect structure includes a dielectric layer, where the dielectric layer has a recess. The interconnect structure further includes a silicon (Si) layer that is deposited in the recess. The interconnect structure also includes a barrier layer and a conductive layer that are provided in the recess over the Si layer. The Si layer has a density that prevents or substantially prevents the barrier layer from moving away from the conductive layer and towards the dielectric layer during subsequent processing of the interconnect structure.

This written description uses examples to disclose the disclosure, including the best mode, and also to enable a person skilled in the art to make and use the disclosure. The patentable scope of the disclosure may include other examples. It should be understood that as used in the description herein and throughout the claims that follow, the meaning of "a," "an," and "the" includes plural reference unless the context clearly dictates otherwise. Also, as used in the description herein and throughout the claims that follow, the meaning of "in" includes "in" and "on" unless the context clearly dictates otherwise. Further, as used in the description herein and throughout the claims that follow, the meaning of "each" does not require "each and every" unless the context clearly dictates otherwise. Finally, as used in the description herein and throughout the claims that follow, the meanings of "and" and "or" include both the conjunctive and disjunctive and may be used interchangeably unless the context expressly dictates otherwise; the phrase "exclusive of" may be used to indicate situations where only the disjunctive meaning may apply.

It is claimed:

1. A method of fabricating an interconnect structure on a wafer, the method comprising:
   providing a dielectric layer on the wafer, the dielectric layer having a recess therein;
   depositing a silicon (Si) layer in the recess;
   forming an interconnect by providing a barrier layer and a conductive layer in the recess over the Si layer;
   forming a nitride layer in a first portion of the Si layer that is adjacent to a top surface of the dielectric layer; and
   forming an oxide layer in a second portion of the Si layer that is adjacent to the first portion.

2. The method of claim 1, further comprising:
   increasing the density of the Si layer using a nitrogen plasma treatment; and
   increasing the density of the Si layer using ultraviolet (UV) curing.

3. The method of claim 1, further comprising wherein the Si layer has a thickness of between about 5 Å and about 100 Å and the Si layer comprises amorphous silicon.

4. The method of claim 3, further wherein depositing the Si layer further comprises depositing the Si layer at a temperature of less than about 500 degrees Celsius using a process selected from the group consisting of a plasma-enhanced chemical vapor deposition (PECVD) process, an atomic layer deposition (ALD) process, or a physical vapor deposition (PVD) process.

5. The method of claim 1, further comprising planarizing the interconnect structure to cause portions of the Si layer, the barrier layer, and the conductive layer to be coplanar with the top surface of the dielectric layer.

6. The method of claim 5, further wherein the first portion of the Si layer extends a depth of about 0 Å to about 200 Å from the top surface, the nitride layer has a thickness of about 5 Å to about 100 Å in a direction that is parallel to the top surface, and the nitride layer has a composition of $Si_3N_x$, where x is within a range of 1 to 4.

7. The method of claim 5 wherein the oxide layer has a thickness of about 5 Å to about 100 Å, and wherein the oxide layer has a composition of $SiO_x$, where x is within a range of 1 to 2.

8. The method of claim 5, wherein forming the nitride layer further comprises using a nitrogen plasma treatment to form the nitride layer; and wherein forming the oxide layer further comprises forming the oxide layer using ultraviolet (UV) curing.

9. The method of claim 5, further comprising:
   depositing an etch stop layer on the planarized interconnect structure; and
   forming the nitride layer further comprises forming the nitride layer using a nitrogen plasma treatment, wherein the nitrogen plasma treatment is performed after planarizing and prior to the depositing of the etch stop layer; and
   forming the oxide layer further comprises forming the oxide layer using UV curing, wherein the UV curing is performed after planarizing and after the depositing of the etch stop layer.

10. The method of claim 8, wherein the nitrogen plasma treatment further comprises exposing the interconnect structure to an NH3 plasma or an N2 plasma.

11. The method of claim 10, further comprising exposing the interconnect structure to the NH3 plasma or the N2 plasma, wherein the nitrogen plasma treatment is performed using a plasma-enhanced chemical vapor deposition (PECVD) process at a temperature of 350 degrees Celsius or about 350 degrees Celsius.

12. The method of claim 5, wherein forming the oxide layer further comprises forming the oxide layer using UV curing, wherein the UV curing further comprises exposing the interconnect structure to ultraviolet radiation having a wavelength in a range of about 200 nm to about 400 nm.

13. The method of claim 12, wherein the UV curing is performed in the presence of a gas selected from the group consisting of Helium, Argon, N2, O2, and O3.

14. The method of claim 12, wherein the UV curing is performed at a temperature within a range of about 200 degrees Celsius to about 500 degrees Celsius, at a pressure within a range of about 1 Torr to about 100 Torr, and for a length of time within a range of about 30 seconds to about 10 minutes.

15. The method of claim 1, wherein the recess is a trench including sidewalls that are substantially vertical and wherein the depositing of the Si layer and the barrier layer causes the sidewalls of the trench to be coated with the Si layer and the barrier layer.

16. A method of fabricating an interconnect structure on a wafer, the method comprising:
   providing a dielectric layer on the wafer, the dielectric layer having a recess therein;
   depositing a silicon layer in the recess;
   forming an interconnect by providing a barrier layer and a conductive layer in the recess over the silicon layer;
   using a nitrogen plasma treatment to transform an upper portion of the silicon layer into a silicon nitride layer; and
   using ultraviolet (UV) curing to transform a lower portion of the silicon layer into a silicon oxide layer.

17. A method comprising:
   providing a semiconductor device including
       a dielectric layer,
       a recess in the dielectric layer,
       a silicon layer covering a sidewall of the recess, and
       a barrier layer covering the Si layer; and
   after providing the barrier layer,
       converting an upper portion of the silicon layer to silicon nitride, and
       converting a lower portion of the Si layer to silicon oxide.

18. The method of claim 17, further comprising:
   planarizing the semiconductor device, before converting the upper portion to silicon nitride and the lower portion to silicon oxide.

19. The method of claim 17, further comprising:
   covering a top of the silicon layer with a second dielectric layer, before converting the upper portion to silicon nitride and the lower portion to silicon oxide; and
   forming a conductive layer in a recess in the barrier layer, before converting the upper portion to silicon nitride and the lower portion to silicon oxide.

20. The method of claim 17, wherein the converting of the upper portion is performed before the converting of the lower portion.

* * * * *